United States Patent
Silvennoinen et al.

(10) Patent No.: US 9,231,490 B2
(45) Date of Patent: Jan. 5, 2016

(54) FREQUENCY CONVERTER UNIT

(75) Inventors: Mika Silvennoinen, Espoo (FI); Mika Vartiainen, Espoo (FI); Jani Hakala, Espoo (FI)

(73) Assignee: ABB TECHNOLOGY OY, Helsinki (FI)

( * ) Notice: Subject to any disclaimer, the term of this patent is extended or adjusted under 35 U.S.C. 154(b) by 322 days.

(21) Appl. No.: 13/441,423

(22) Filed: Apr. 6, 2012

(65) Prior Publication Data

US 2012/0257338 A1    Oct. 11, 2012

(30) Foreign Application Priority Data

Apr. 8, 2011   (EP) .................................... 11161601

(51) Int. Cl.
| | |
|---|---|
| H02M 7/00 | (2006.01) |
| H02M 5/00 | (2006.01) |
| H02B 1/00 | (2006.01) |
| H02B 1/21 | (2006.01) |
| H02B 11/12 | (2006.01) |

(52) U.S. Cl.
CPC ................ *H02M 7/003* (2013.01); *H02M 5/00* (2013.01); *H02B 1/21* (2013.01); *H02B 11/12* (2013.01)

(58) Field of Classification Search
CPC ......... H02B 1/21; H02B 11/12; H02M 7/003; H02M 5/00
USPC ................... 361/600–678, 724–727
See application file for complete search history.

(56) References Cited

U.S. PATENT DOCUMENTS

| | | | | |
|---|---|---|---|---|
| 3,855,504 | A * | 12/1974 | Olashaw | 361/614 |
| 5,245,506 | A | 9/1993 | Tanimizu | |
| 7,173,810 | B2 * | 2/2007 | Rowe et al. | 361/611 |
| 7,336,477 | B2 * | 2/2008 | Weister et al. | 361/676 |
| 8,094,435 | B2 * | 1/2012 | Howes et al. | 361/614 |
| 8,223,499 | B2 * | 7/2012 | Thomsen | 361/728 |
| 8,564,963 | B2 * | 10/2013 | Thomsen | 361/728 |
| 2007/0030651 | A1 | 2/2007 | Vartiainen | |
| 2011/0069520 | A1 | 3/2011 | Rantanen | |

FOREIGN PATENT DOCUMENTS

| | | |
|---|---|---|
| CN | 201167284 Y | 12/2008 |
| CN | 201577024 U | 9/2010 |

(Continued)

OTHER PUBLICATIONS

Office Action (First Office Action) issued on Feb. 25, 2014, by the Chinese Patent Office in corresponding Chinese Patent Application No. 201210098078.2, and an English Translation of the Office Action. (11 pages).

(Continued)

*Primary Examiner* — Zachary M Pape
(74) *Attorney, Agent, or Firm* — Buchanan Ingersoll & Rooney PC (57) ABSTRACT

A frequency converter unit includes a unit body, input bus bar means and output bus bar means. The input bus bar means have a plurality of input side bus bars spaced apart in a first direction, and the output bus bar means have a plurality of output side bus bars spaced apart in the first direction, which is perpendicular to an installation direction of the frequency converter unit. Each of the plurality of input side bus bars and the plurality of output side bus bars includes an aperture configured to connect the bus bar to a counterpart contact in a frame with a bolt-nut connection.

7 Claims, 8 Drawing Sheets

(56) References Cited

FOREIGN PATENT DOCUMENTS

| | | |
|---|---|---|
| CN | 201708685 U | 1/2011 |
| CN | 201717775 U | 1/2011 |
| EP | 0 498 271 A1 | 8/1992 |
| EP | 2 302 780 A2 | 3/2011 |

OTHER PUBLICATIONS

Search Report issued on Dec. 29, 2011, by European Patent Office for Application No. 11161601.7.

* cited by examiner

FREQUENCY CONVERTER UNIT

RELATED APPLICATION

This application claims priority under 35 U.S.C. §119 to European Patent Application No. 11161601.7 filed in Europe on Apr. 8, 2011, the entire content of which is hereby incorporated by reference in its entirety.

FIELD

The present disclosure relates to a frequency converter unit.

BACKGROUND INFORMATION

A known frequency converter unit includes cable terminals for power supply cabling and load cabling on a front side wall thereof. The known frequency converter unit is adapted to be installed in a frame having power supply cabling and load cabling on a front wall thereof. The power supply cabling is fixedly connected to the cable terminals for power supply cabling on the front side wall of the known frequency converter unit. Similarly, the load cabling is fixedly connected to the cable terminals for load cabling on the front side wall of the known frequency converter unit.

One of the drawbacks associated with the above described known frequency converter unit is that there are considerable difficulties in installing the known frequency converter unit in a frame having the power supply cabling and load cabling on a side wall thereof or on a back wall thereof.

SUMMARY

An exemplary embodiment of the present disclosure includes a frequency converter unit which includes a unit body, input bus bar means having a plurality of input side bus bars protruding from the unit body and configured to be connected to a power supply, and output bus bar means having a plurality of output side bus bars protruding from the unit body and configured to be connected to a load. The frequency converter unit is configured to be installed in a frame in an installed position, where the installation of the frequency converter unit into the frame is configured to be carried out in an installation direction. The plurality of input side bus bars are spaced apart in a first direction, and the plurality of output side bus bars are spaced apart in the first direction, which is perpendicular to the installation direction. Each of plurality of input side bus bars and the plurality of output side bus bars includes an aperture configured to connect the bus bar to a counterpart contact in the frame with a bolt-nut connection.

An exemplary embodiment of the present disclosure provides a frequency converter unit which includes a unit body, input bus bar means having a plurality of input side bus bars protruding from the unit body and configured to be connected to a power supply, and output bus bar means having a plurality of output side bus bars protruding from the unit body and configured to be connected to a load. The frequency converter unit is configured to be installed in a frame in an installed position, where the installation of the frequency converter unit into the frame is configured to be carried out in an installation direction. The plurality of input side bus bars are spaced apart in a first direction, and the plurality of output side bus bars are spaced apart in the first direction, which is perpendicular to the installation direction. Each of the plurality of input side bus bars and the plurality of output side bus bars includes an aperture configured to connect the bus bar to a counterpart contact in the frame with a bolt-nut connection. In addition, each of the plurality of input side bus bars and the plurality of output side bus bars is configured to form an electrical contact with a blade receiving counterpart contact in the frame.

BRIEF DESCRIPTION OF THE DRAWINGS

In the following, additional refinements, advantages and features of the present disclosure will be described in greater detail by means of exemplary embodiments with reference to the attached drawings, in which.

DETAILED DESCRIPTION

Exemplary embodiments of the present disclosure provide a frequency converter unit which can easily be installed in a frame having the power supply cabling and load cabling on a side wall thereof. An exemplary embodiment of the present disclosure includes a frequency converter unit which includes a unit body, input bus bar means having a plurality of input side bus bars protruding from the unit body and configured to be connected to a power supply, and output bus bar means having a plurality of output side bus bars protruding from the unit body and configured to be connected to a load. The frequency converter unit is configured to be installed in a frame in an installed position, where the installation of the frequency converter unit into the frame is configured to be carried out in an installation direction. The plurality of input side bus bars are spaced apart in a first direction, and the plurality of output side bus bars are spaced apart in the first direction, which is perpendicular to the installation direction. Each of plurality of input side bus bars and the plurality of output side bus bars includes an aperture configured to connect the bus bar to a counterpart contact in the frame with a bolt-nut connection. In accordance with an exemplary embodiment, each of the plurality of input side bus bars and the plurality of output side bus bars is configured to form an electrical contact with a blade receiving counterpart contact in the frame.

Exemplary embodiments of the present disclosure are based on the idea of providing a frequency converter unit with input side bus bars which are spaced apart in a first direction, and with output side bus bars which are spaced apart in the first direction, where the first direction is perpendicular to installation direction of the frequency converter unit.

An advantage of the frequency converter unit of the present disclosure is that the frequency converter unit may be installed in several different positions, wherein a power supply cabling and load cabling may be provided on different sides of a frame in which the frequency converter unit is installed.

Figure 1A:
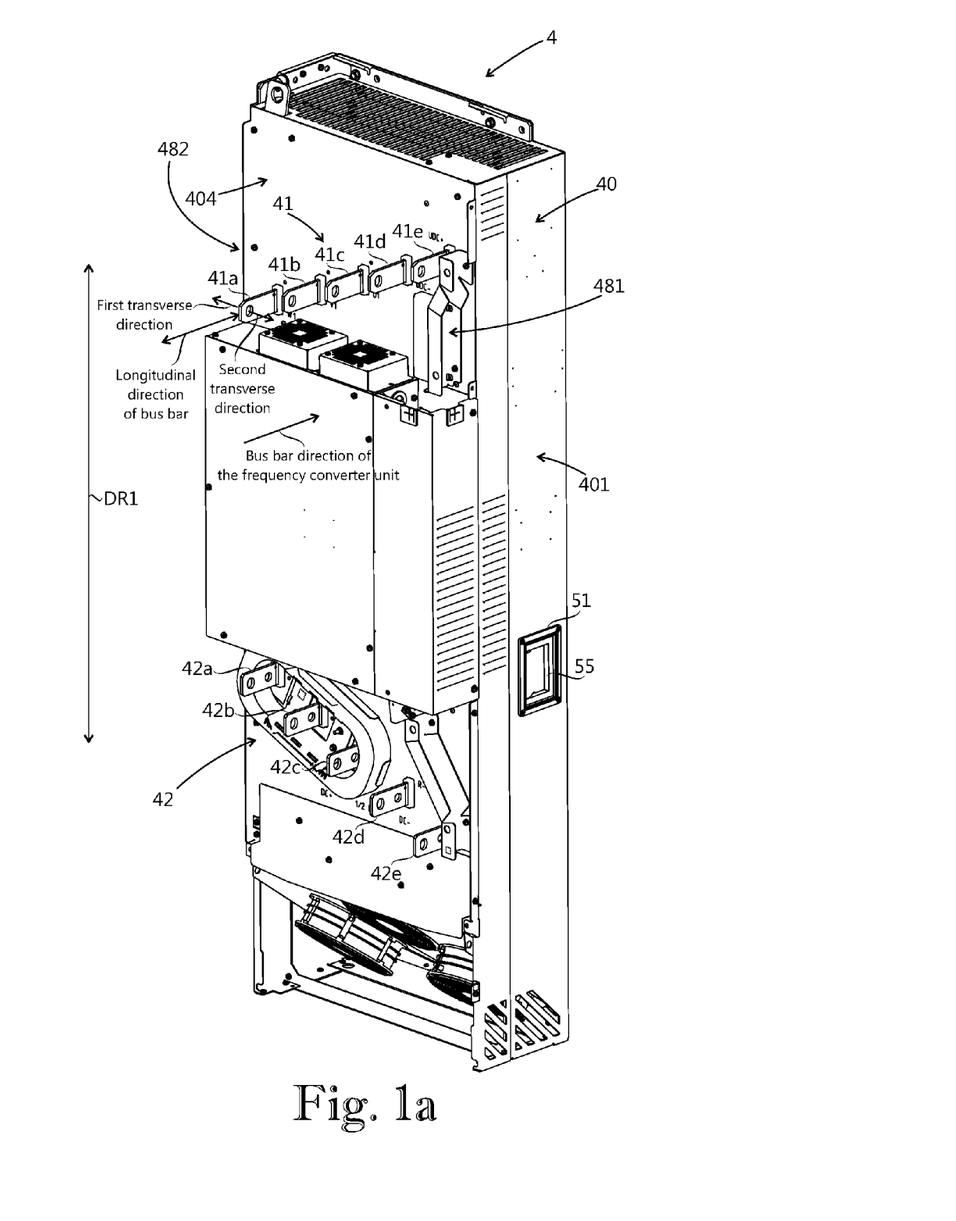
FIGS. 1a and 1b show axonometric views of a frequency converter unit according to an exemplary embodiment of the present disclosure.
Figure 1B:
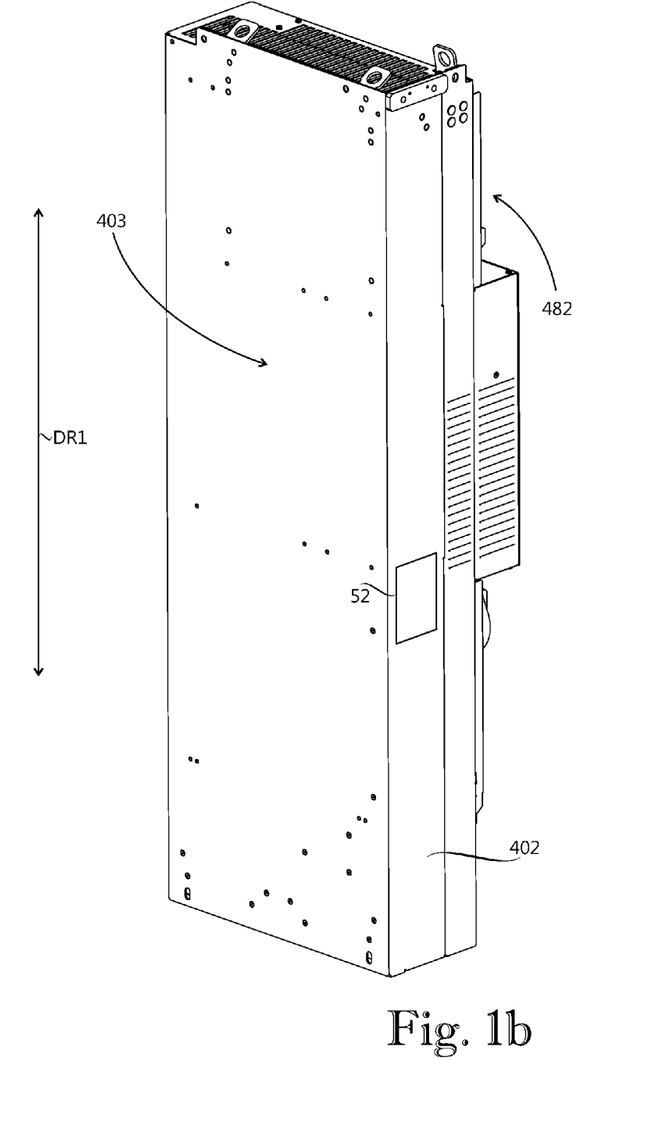

FIGS. 1a and 1b show axonometric views of a frequency converter unit 4 according to an exemplary embodiment of the present disclosure. FIG. 1a shows that the frequency converter unit 4 includes a unit body 40, input bus bar means 41 and output bus bar means 42. The input bus bar means 41 have a plurality of input side bus bars 41a, 41b, 41c, 41d, 41e protruding from the unit body 40. The input side bus bars 41a, 41b and 41c are configured to be connected to corresponding phase conductors of a three-phase power supply. The input side bus bars 41d and 41e are connected to a direct voltage intermediate circuit of the frequency converter unit 4, thereby providing a direct voltage supply. The output bus bar means 42 have a plurality of output side bus bars 42a, 42b, 42c, 42d, 42e protruding from the unit body 40. The output side bus bars 42a, 42b are 42c configured to be connected to a corresponding phase conductors of a three-phase load. The output side bus bars 42d and 42e are bus bars of a brake chopper circuit of the frequency converter unit 4. The output side bus bars 42d and 42e are configured to be connected to an external brake resistor. Brake chopper circuits and external brake resistors are known in the art and therefore they are not discussed herein.

In accordance with an exemplary embodiment, bus bars that are connected to a direct voltage intermediate circuit of the frequency converter unit may be situated adjacent bus bars configured to be connected to a corresponding phase conductors of a three-phase load. In this embodiment, bus bars configured to be connected to an external brake resistor are situated adjacent bus bars configured to be connected to corresponding phase conductors of a three-phase power supply. In this embodiment, bus bars configured to be connected to an external brake resistor would be categorized as input side bus bars because of their location. Further, bus bars that are connected to a direct voltage intermediate circuit of the frequency converter would be categorized as output side bus bars because of their location. A frequency converter unit according to this alternative embodiment could look exactly like the frequency converter unit of FIG. 1a, but the functionality of input side bus bars 41d and 41e would be interchanged with functionality of output side bus bars 42d and 42e.

Both the input side bus bars 41a, 41b, 41c, 41d, 41e and the output side bus bars 42a, 42b, 42c, 42d, 42e are located on a bus bar side wall 404 of the unit body 40. This enables connecting both power supply cabling and load cabling on a same side of the frequency converter unit 4.

Figure 2A:
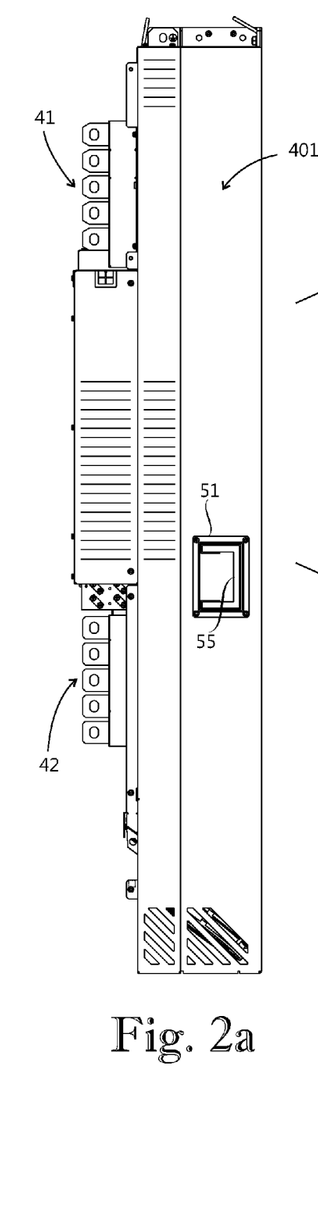
FIGS. 2a-2d show side views of the frequency converter unit of FIG. 1.
Figure 2B:
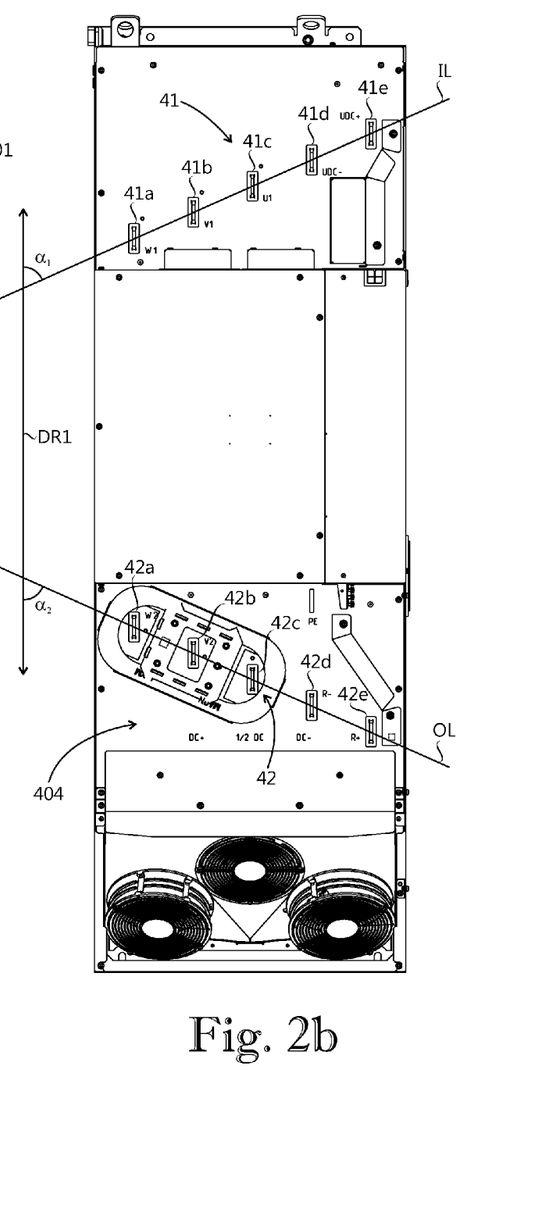
Figure 2C:
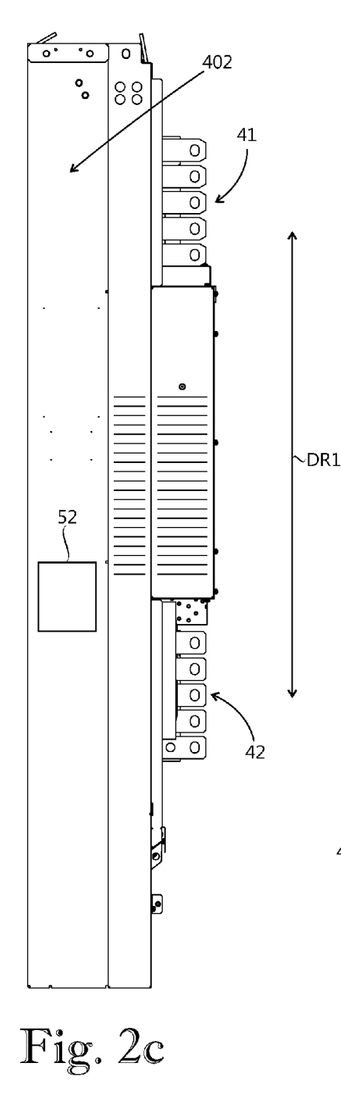
Figure 2D:
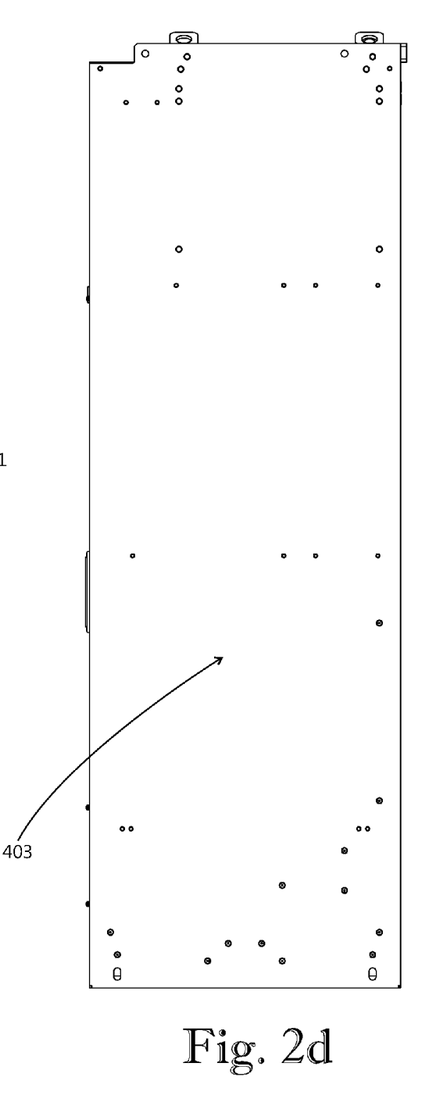

FIGS. 2a-2d show side views of the frequency converter unit of FIG. 1. FIGS. 2a, 2b and 2c show that the input side bus bars 41a, 41b, 41c, 41d, 41e are spaced apart in a first direction DR1, which is parallel to a vertical direction in the drawings. Also, the output side bus bars 42a, 42b, 42c, 42d, 42e are spaced apart in the first direction DR1.

FIG. 2b shows that the input side bus bars 41a, 41b, 41c, 41d, 41e are situated on an input side bus bar line IL which lies at a first angle $\alpha_1$ with respect to the first direction DR1. The output side bus bars 42a, 42b, 42c, 42d, 42e are situated on an output side bus bar line OL which lies at a second angle $\alpha_2$ with respect to the first direction DR1. The absolute value of the first angle $\alpha_1$ is approximately 65°. The absolute value of the second angle $\alpha_2$ is substantially equal to the absolute value of the first angle $\alpha_1$. The first angle $\alpha_1$ has an opposite sign compared to the sign of the second angle $\alpha_2$ so that angle between the input side bus bar line IL and the output side bus bar line OL is approximately 50°. The input side bus bar line IL and the output side bus bar line OL are in such an angle that they form an arrowhead shape. In accordance with an exemplary embodiment, the angle between the input side bus bar line and the output side bus bar line may be between 25° and 75°.

The frequency converter unit 4 includes a first user interface position 481 on a first side wall 401 of the unit body 40, where the first side wall 401 extends perpendicular with respect to the bus bar side wall 404. The frequency converter unit 4 also includes a second user interface position 482 on a second side wall 402 of the unit body 40, where the second side wall 402 extends perpendicular with respect to the bus bar side wall 404 and parallel with respect to the first side wall 401. Each of the user interface positions are configured to receive a user interface unit for controlling the frequency converter unit 4.

There is a first handle position 51 on the first side wall 401 of the unit body 40. A handle 55 is received in the first handle position 51 for moving the frequency converter unit 4. The frequency converter unit 4 also includes a second handle position 52 on the second side wall 402 of the unit body 40. The second handle position 52 is configured to receive a handle for moving the frequency converter unit 4.

Figure 3A:
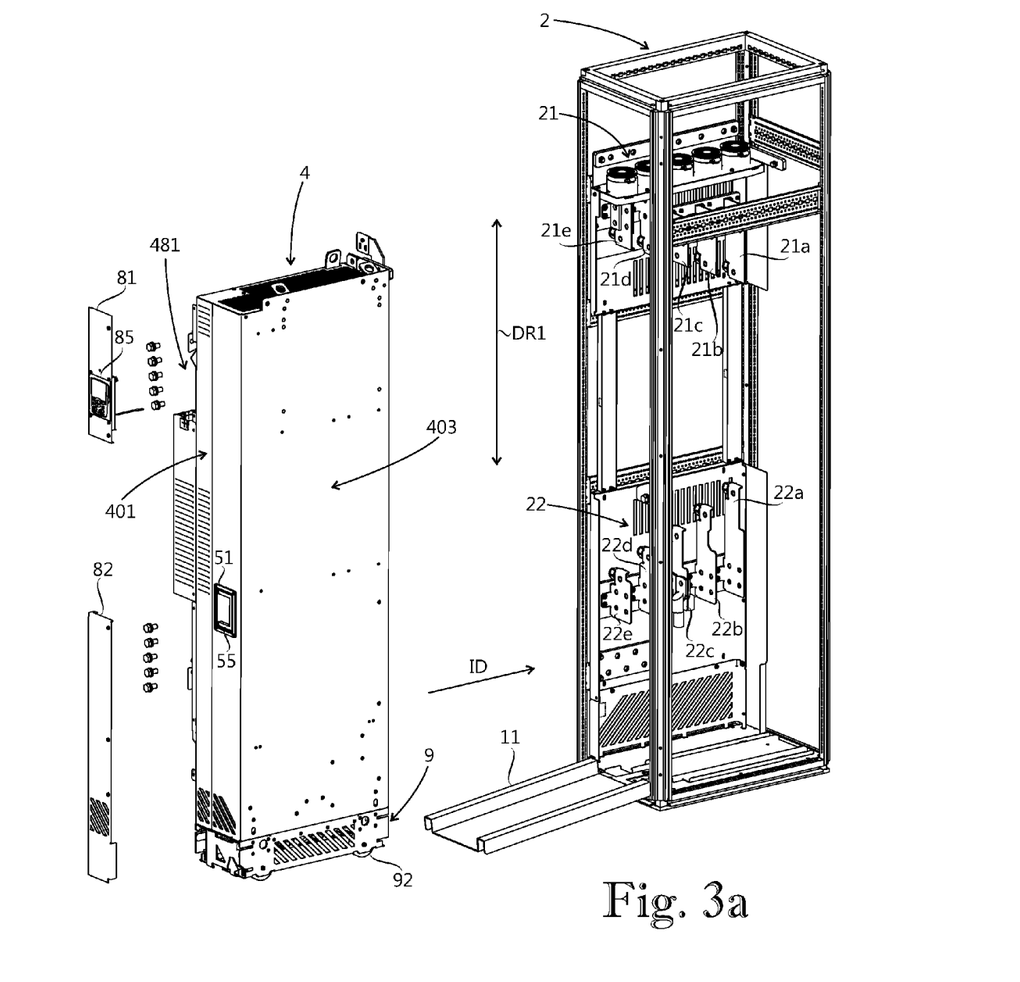
FIGS. 3a-3c show axonometric views of a frequency converter assembly according to an exemplary embodiment of the disclosure and including the frequency converter unit of FIG. 1.

FIG. 3a shows a frequency converter assembly according to an exemplary embodiment of the present disclosure which includes a frame 2 and the frequency converter unit 4 of FIG. 1. The frame 2 includes an input cabling panel 21 configured to be connected to a power supply and an output cabling panel 22 configured to be connected to a load.

The input cabling panel 21 is configured to electrically connect the input bus bar means 41 of the frequency converter unit 4 to the power supply. The output cabling panel 22 is configured to electrically connect the output bus bar means 42 of the frequency converter unit 4 to the load. The input cabling panel 21 includes input contacts 21a, 21b, 21c, 21d, 21e configured to be connected to the input side bus bars 41a, 41b, 41c, 41d, 41e of the frequency converter unit 4. The output cabling panel 22 includes output contacts 22a, 22b, 22c, 22d, 22e configured to be connected to the output side bus bars 42a, 42b, 42c, 42d, 42e of the frequency converter unit 4.

The input cabling panel may include cable terminals for input cables. The output cabling panel may include cable terminals for output cables.

Figure 3B:
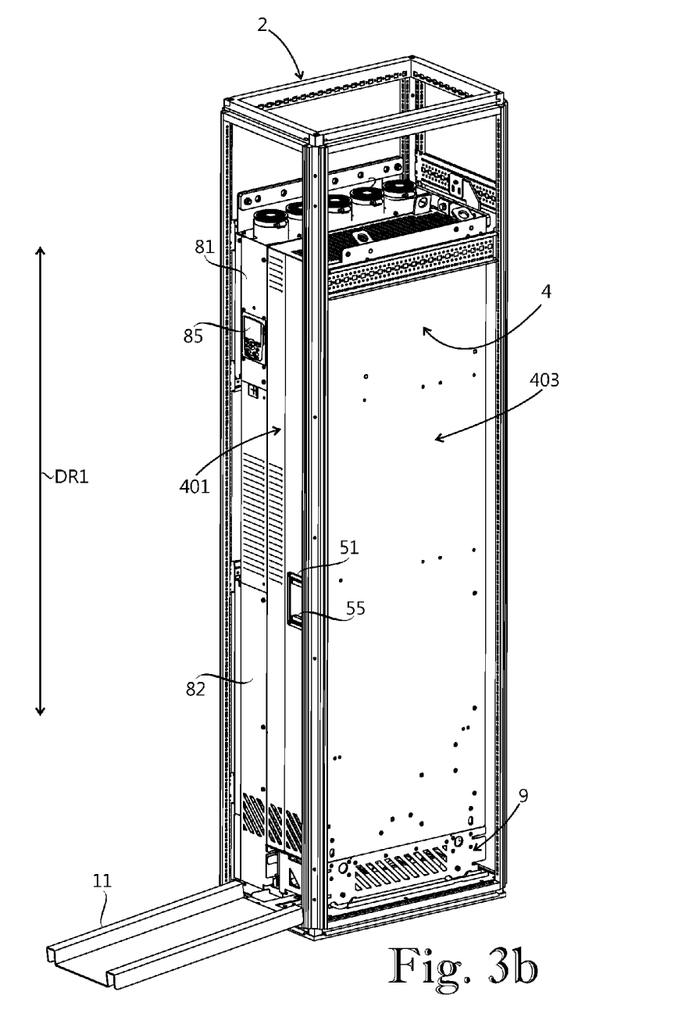
Figure 3C:
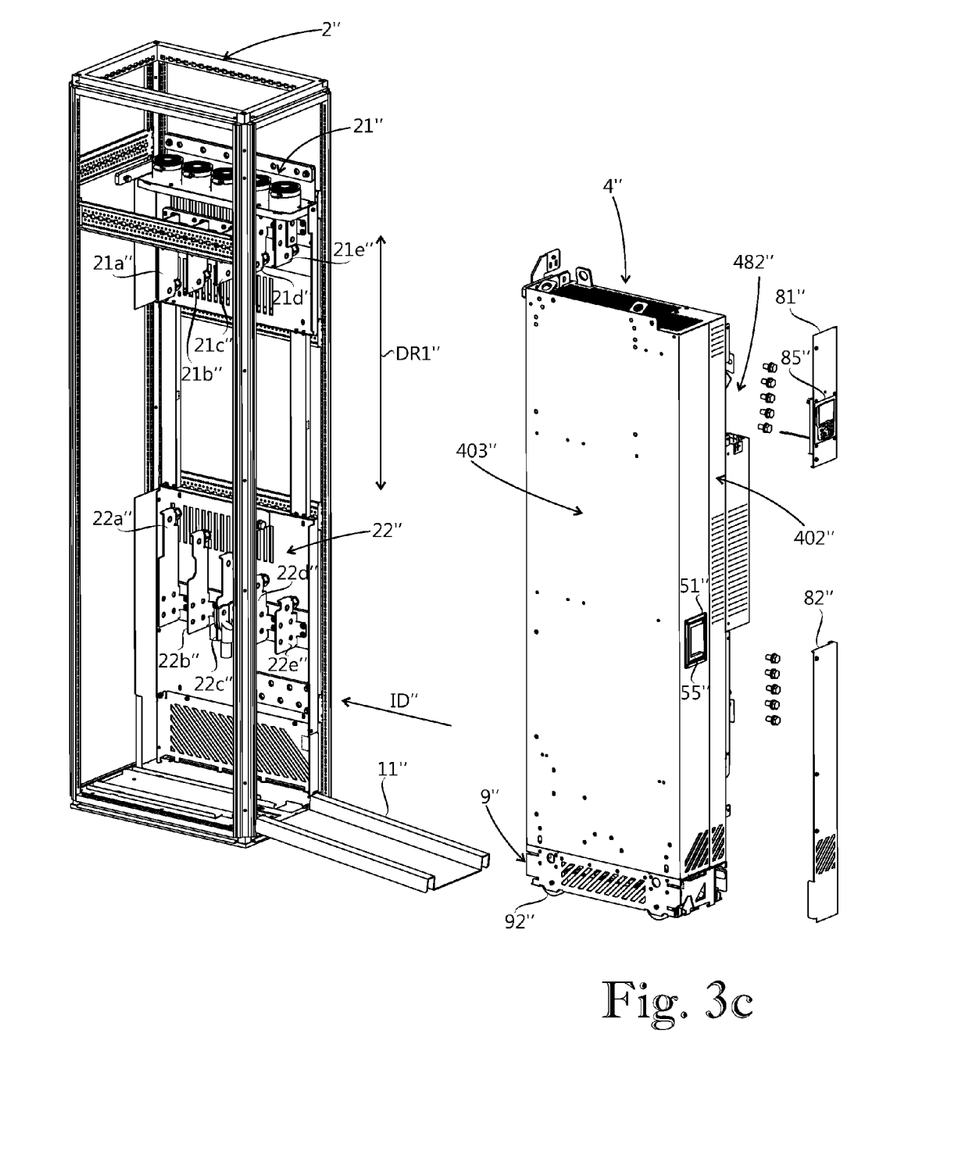

The frequency converter unit 4 is configured to be installed in the frame 2 in an installed position depicted in FIG. 3b. The installation of the frequency converter unit 4 is configured to be carried out in an installation direction ID shown by an arrow in FIG. 3a. The installation direction ID is perpendicular to the first side wall 401, the second side wall 402 and the first direction DR1. The installation direction ID is parallel to the third side wall 403 and the bus bar side wall 404.

FIG. 3a shows that it is important that both the input side bus bars and the output side bus bars are spaced apart in the first direction DR1. If the input side bus bars and/or the output side bus bars were not spaced apart in the first direction, it would be impossible to get the input side bus bars adjacent to the input contacts and the output side bus bars adjacent to the output contacts simply by pushing the frequency converter unit into the frame in an installation direction.

In the installed position, the input side bus bars 41a, 41b, 41c, 41d, 41e are adjacent to the input contacts 21a, 21b, 21c, 21d, 21e, respectively, and the output side bus bars 42a, 42b, 42c, 42d, 42e are adjacent to the output contacts 22a, 22b, 22c, 22d, 22e, respectively. The input side bus bars may be secured to the input contacts by bolts and nuts to ensure an appropriate electrical connection. Similarly, the output side bus bars may be secured to the output contacts by bolts and nuts to ensure an appropriate electrical connection. Also, other detachable connecting means may be used instead of bolts and nuts.

Use of detachable connecting means is not necessary in every embodiment. Each of the input side bus bars and the output side bus bars shown in FIG. 1a has a substantially planar form with bevelled front edges. The form of the bus bars makes them suitable for forming an electrical contact with blade receiving counterpart contacts in the frame. The blade receiving counterpart contact may be a blade receiving counterpart contact having a substantially V-shaped slot configured to receive a corresponding bus bar therein for forming an electrical contact. Alternatively, the blade receiving counterpart contact may have a one-sided structure wherein the blade receiving counterpart contact is configured to contact a corresponding bus bar only on one side. A contact event between a bus bar and a one-sided blade receiving counterpart contact resembles movement of bypassing blades of scissors. When a frame is provided with blade receiving counterpart contacts, the installation direction of the frequency converter unit must be parallel to longitudinal direction of the bus bars.

FIG. 3a shows a first cover plate 81 and a second cover plate 82 configured to be installed on the first side wall 401 of the frequency converter unit 4. There is a user interface unit 85 mounted on the first cover plate 81. The user interface unit 85 is configured to control the frequency converter unit 4. In FIG. 3b, the first cover plate 81 and the second cover plate 82 are installed on the first side wall 401 of the frequency converter unit 4, and the user interface unit 85 is received in the first user interface position 481.

In FIG. 3a, the frequency converter unit 4 is placed on a unit car 9 which is provided with wheels 92. The unit car 9 is configured to facilitate moving of the frequency converter unit 4. FIG. 3a further shows a unit ramp 11 which is configured to facilitate pushing of the frequency converter unit 4 to the installed position.

The frequency converter unit 4 is configured to be installed in four different types of frames. The frame 2 depicted in FIG. 3a is a first type frame which is configured to receive power supply cabling and load cabling on a left wall thereof due to the location of the input cabling panel 21 and the output cabling panel 22. A second type frame is configured to receive power supply cabling and load cabling on a right wall thereof, which means that an input cabling panel and an output cabling panel are located on the right wall. A third type frame is configured to receive power supply cabling and load cabling on a front wall thereof. When the frequency converter unit 4 is installed in the third type frame the power supply cabling and load cabling may be connected to the input bus bar means 41 and output bus bar means 42 directly without any cabling panels by using appropriate cable terminals. A fourth type frame is configured to receive power supply cabling and load cabling on a back wall thereof.

A left wall of a frame is parallel to a right wall of the frame. A back wall of a frame is parallel to a front wall of the frame. Expressions left wall, right wall, front wall and back wall of a frame refer to the installation direction in the illustrated embodiment. The left wall and the right wall are parallel to the installation direction while the front wall and back wall are perpendicular to the installation direction. A front wall is the wall through which the frequency converter unit is moved to the installed position. In FIG. 3a, a front wall of the frame 2 is closer to the frequency converter unit 4 than a back wall of the frame 2. The front wall of the frame 2 is an open wall enabling pushing the frequency converter unit 4 to the installed position depicted in FIG. 3b.

Figure 4A:
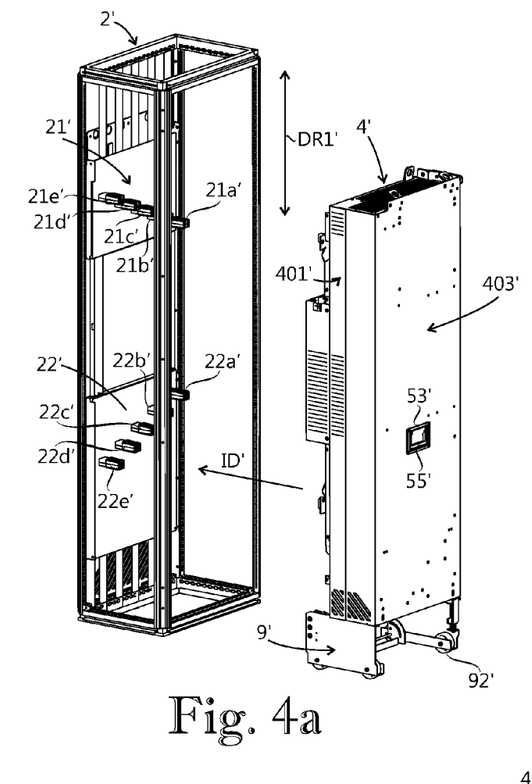
FIGS. 4a and 4b show axonometric views of a frequency converter assembly according to an exemplary embodiment of the present disclosure.
Figure 4B:
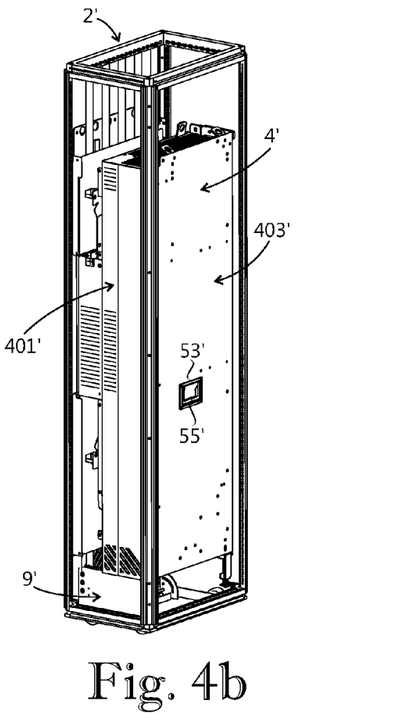

FIG. 4a shows a frequency converter assembly according to an exemplary embodiment of the present disclosure which includes a frame 2' and a frequency converter unit 4'. The frame 2' includes an input cabling panel 21' configured to be connected to a power supply and an output cabling panel 22' configured to be connected to a load.

The main difference between the frequency converter assembly of FIG. 4a and the frequency converter assembly of FIG. 3a is that the installation direction ID' of the frequency converter assembly of FIG. 4a is perpendicular to the bus bar side wall of the frequency converter unit 4', and that the input cabling panel 21' and the output cabling panel 22' are located on a back wall of the frame 2'. In other words, the frame 2' is the fourth type frame described earlier.

There are two differences between the frequency converter unit 4' of FIG. 4a and the frequency converter unit 4 of FIG. 3a. The first difference is that the input side bus bars 41a-41e and the output side bus bars 42a-42e of the frequency converter unit 4 have been replaced with blade contacts configured to co-operate with blade receiving input contacts 21a'-21e' and blade receiving output contacts 22a'-22e', respectively. The use of blade contacts and their counterparts ensure reliable electrical contact between the frequency converter unit 4' and input/output cabling without any additional securing operation. This is an advantageous feature in assemblies where the installed position is such that it would be difficult to carry out any securing actions due to lack of space for example. However, it should be understood that blade contacts or other type of fast coupling connectors may be used in all types of frequency converter assemblies according to present disclosure. As used herein, fast coupling connector means any electrical connector type that achieves reliable electrical contact simply by pushing a contact member into its counterpart.

The second difference is that there is a third handle position 53' on a third side wall 403'. A handle 55' is received in the third handle position 53' for moving the frequency converter unit 4'. The handle 55' is identical with the handle 55.

In FIG. 4a, the frequency converter unit 4' is placed on a unit car 9' which is provided with wheels 92'. The unit car 9' is configured to facilitate moving of the frequency converter unit 4'.

Several frequency converter assemblies according to above described embodiments may be installed side by side. It is also possible to install several frequency converter assemblies one on the other. Although the first side wall, the second side wall, the third side wall and the bus bar side wall are vertical walls in the above described embodiment, it is clear that in further embodiments the first side wall or the bus bar side wall may be a horizontal wall.

It will be obvious to a person skilled in the art that the inventive concept can be implemented in various ways. The invention and its embodiments are not limited to the examples described above but may vary within the scope of the claims.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A frequency converter unit comprising:
   a unit body;
   input bus bar means having a plurality of input side bus bars protruding from the unit body and configured to be connected to a power supply;
   output bus bar means having a plurality of output side bus bars protruding from the unit body and configured to be connected to a load,
   wherein the frequency converter unit is configured to be installed in a first type frame and in a second type frame in corresponding installed positions, each of the first type frame and the second type frame being a bolt type frame provided with counterpart contacts configured for bolt-nut connections, the installation of the frequency converter unit into the first type frame and the second type frame being configured to be carried out in corresponding installation directions, wherein the plurality of input side bus bars are spaced apart in a first direction, and the plurality of output side bus bars are spaced apart in the first direction, the first direction being perpendicular to the installation directions corresponding to the first type frame and the second type frame, wherein each of the plurality of input side bus bars and the plurality of output side bus bars includes an aperture configured to connect the bus bar to a counterpart contact in the first type frame and the second type frame with a bolt-nut connection, wherein the frequency converter unit is configured to be installed in a blade type frame provided with blade receiving counterpart contacts, and each of the plurality of input side bus bars and the plurality of output side bus bars is configured to form an electrical contact with a blade receiving counterpart contact in the blade type frame, wherein both the input side bus bars and the output side bus bars are located on a bus bar side wall of the unit body, wherein each of the input side bus bars and output side bus bars has a longitudinal direction which is parallel to a bus bar direction of the frequency converter unit, and each of the input side bus bars and output side bus bars is freely accessible in the bus bar direction to enable installation of the frequency converter unit in the blade type frame such that a corresponding installation direction is parallel to the bus bar direction and each of the plurality of input side bus bars and the plurality of output side bus bars forms an electrical contact with a blade receiving counterpart contact in the blade type frame when the frequency converter unit is installed into the blade type frame in the corresponding installation direction, and wherein each of the input side bus bars and output side bus bars protrudes from the bus bar side wall of the unit body and the bus bar direction of the frequency converter unit is substantially perpendicular to the bus bar side wall of the unit body.

2. A frequency converter unit according to claim 1 wherein the frequency converter unit comprises a handle position on both walls of the frequency converter unit extending perpendicular to the installation directions corresponding to the first type frame and the second type frame, each of the handle positions being configured to receive a handle for moving the frequency converter unit.

3. A frequency converter unit according to claim 1 wherein each of the input side bus bars and output side bus bars is freely accessible in a first transverse direction and second transverse direction opposite to the first transverse direction to enable installation of the frequency converter unit in the first type frame in an installation direction coinciding with the first transverse direction and in the second type frame in an installation direction coinciding with the second transverse direction, wherein the first transverse direction and the second transverse direction are perpendicular to the longitudinal direction of the input side bus bars and output side bus bars.

4. A frequency converter unit according to claim 3 wherein each of the input side bus bars and output side bus bars has a substantially planar first lateral face and a substantially planar second lateral face substantially parallel to the first lateral face and facing substantially in opposite direction, each of the first lateral face and second lateral face facing in a direction substantially perpendicular to the bus bar direction of the frequency converter unit, and each of the first lateral face and second lateral face is adapted to form an electrical contact with a counterpart contact provided in the bolt type frame and adapted for a bolt-nut connection.

5. A frequency converter according to claim 3 wherein the first transverse direction and the second transverse direction are parallel to a respective center line of the aperture in each corresponding one of the plurality of input side bus bars and the plurality of output side bus bars.

6. A frequency converter unit comprising:
a unit body;
input bus bar means having a plurality of input side bus bars protruding from the unit body and configured to be connected to a power supply;
output bus bar means having a plurality of output side bus bars protruding from the unit body and configured to be connected to a load, wherein the frequency converter unit is configured to be installed in a first type frame and in a second type frame in corresponding installed positions, each of the first type frame and the second type frame being a bolt type frame provided with counterpart contacts configured for bolt-nut connections, the installation of the frequency converter unit into the first type frame and the second type frame being configured to be carried out in corresponding installation directions, wherein the plurality of input side bus bars are spaced apart in a first direction, and the plurality of output side bus bars are spaced apart in the first direction, the first direction being perpendicular to the installation directions corresponding to the first type frame and the second type frame, wherein each of the plurality of input side bus bars and the plurality of output side bus bars includes an aperture configured to connect the bus bar to a counterpart contact in the first type frame and the second type frame with a bolt-nut connection, wherein the frequency converter is configured to be installed in a blade type frame provided with blade receiving contacts, and each of the plurality of input side bus bars and the plurality of output side bus bars is configured to form an electrical contact with a blade receiving counterpart contact in the blade type frame, wherein both the input side bus bars and the output side bus bars are located on a bus bar side wall of the unit body, wherein each of the input side bus bars and output side bus bars has a longitudinal direction which is parallel to a bus bar direction of the frequency converter unit, and each of the input side bus bars and output side bus bars is freely accessible in the bus bar direction to enable installation of the frequency converter unit in the blade type frame such that a corresponding installation direction is parallel to the bus bar direction and each of the plurality of input side bus bars and the plurality of output side bus bars forms an electrical contact with a blade receiving counterpart contact in the blade type frame when the frequency converter unit is installed into the blade type frame in the corresponding direction, wherein each of the input side bus bars and output side bus bars protrudes from the bus bar side wall of the unit body and the bus bar direction of the frequency converter unit is substantially perpendicular to the bus bar side wall of the unit body, wherein the input bus bar means and the output bus bar means are configured to allow installation of the frequency converter unit in four different type of frames, which include a first type frame having power supply cabling and load cabling on a left wall thereof, a second type frame having power supply cabling and load cabling on a right wall thereof, a third type frame having power supply cabling and load cabling on a front wall thereof, and a fourth type frame having power supply cabling and load cabling on a back wall thereof, wherein the frequency converter unit is configured to be installed in each above mentioned frame type such that the bus bar side wall of the unit body is facing the wall having the power supply cabling and load cabling, and wherein the frequency converter unit comprises a user interface position on both side walls of the frequency converter unit extending perpendicular to the installation directions corresponding to the first type frame and the second type frame, each of the user interface positions being configured to receive a user interface unit for controlling the frequency converter unit.

7. A frequency converter unit according to claim 6 wherein the frequency converter unit comprises a handle position on both walls of the frequency converter unit extending perpendicular to the installation directions corresponding to the first type frame and the second type frame, each of the handle positions being configured to receive a handle for moving the frequency converter unit.

* * * * *